(12) United States Patent
Ikeda et al.

(10) Patent No.: US 11,929,234 B2
(45) Date of Patent: Mar. 12, 2024

(54) PLASMA PROCESSING APPARATUS AND LOWER STAGE

(71) Applicants: TOKYO ELECTRON LIMITED, Tokyo (JP); TOHOKU UNIVERSITY, Miyagi (JP)

(72) Inventors: Taro Ikeda, Yamanashi (JP); Sumi Tanaka, Yamanashi (JP); Satoru Kawakami, Yamanashi (JP); Masaki Hirayama, Tokyo (JP)

(73) Assignees: TOKYO ELECTRON LIMITED, Tokyo (JP); TOHOKU UNIVERSITY, Miyagi (JP)

( * ) Notice: Subject to any disclaimer, the term of this patent is extended or adjusted under 35 U.S.C. 154(b) by 358 days.

(21) Appl. No.: 17/299,483

(22) PCT Filed: Nov. 26, 2019

(86) PCT No.: PCT/JP2019/046216
§ 371 (c)(1),
(2) Date: Jun. 3, 2021

(87) PCT Pub. No.: WO2020/116247
PCT Pub. Date: Jun. 11, 2020

(65) Prior Publication Data
US 2022/0068603 A1  Mar. 3, 2022

(30) Foreign Application Priority Data
Dec. 6, 2018  (JP) ................................. 2018-229249

(51) Int. Cl.
*H01J 37/32* (2006.01)

(52) U.S. Cl.
CPC .. *H01J 37/32155* (2013.01); *H01J 37/32541* (2013.01); *H01J 37/32568* (2013.01); *H01J 37/32724* (2013.01)

(58) Field of Classification Search
CPC .......... H01J 37/32155; H01J 37/32541; H01J 37/32568; H01J 37/32724;
(Continued)

(56) References Cited

U.S. PATENT DOCUMENTS

| 2011/0006040 A1* | 1/2011 | Savas ................... C23C 16/407 |
| | | 427/579 |
| 2012/0205046 A1* | 8/2012 | Janakiraman ....... C23C 16/5096 |
| | | 156/345.34 |

FOREIGN PATENT DOCUMENTS

| CN | 112349575 A * | 2/2021 | ....... C23C 16/45565 |
| JP | 8-186094 A | 7/1996 | |

(Continued)

*Primary Examiner* — Abdullah A Riyami
*Assistant Examiner* — Syed M Kaiser
(74) *Attorney, Agent, or Firm* — Nath, Goldberg & Meyer; Jerald L. Meyer; Tanya E. Harkins

(57) ABSTRACT

A plasma processing apparatus capable of improving the in-plane uniformity of plasma and a lower stage used for the plasma processing apparatus are anticipated. In an exemplary embodiment, the lower stage is for a lower stage that generates plasma with an upper electrode. The lower stage includes: a lower dielectric body formed of ceramic, a lower electrode embedded in the lower dielectric body, and a heating element embedded in the lower dielectric body. The separation distance between the top surface of the lower dielectric body at the outer edge position thereof and the lower electrode is smaller than the separation distance between the top surface of the lower dielectric body in the central region thereof and the lower electrode. The lower electrode has an inclination region inclined with respect to the top surface between the outer edge position and the central region.

6 Claims, 3 Drawing Sheets

(58) Field of Classification Search
CPC .......... H01J 37/32174; H01J 37/32091; H01L 21/683; H05H 1/46
See application file for complete search history.

(56) References Cited

FOREIGN PATENT DOCUMENTS

| | | | | |
|---|---|---|---|---|
| JP | H08186094 A | * | 7/1996 | ........ H01J 37/32541 |
| JP | 9-503350 A | | 3/1997 | |
| JP | 9-312268 A | | 12/1997 | |
| JP | 2001-250815 A | | 9/2001 | |
| JP | 2001250815 A | * | 9/2001 | ........ H01J 37/32082 |
| JP | 2003-506889 A | | 2/2003 | |
| JP | 2011-519117 A | | 6/2011 | |
| JP | 2014-53309 A | | 3/2014 | |

* cited by examiner

PLASMA PROCESSING APPARATUS AND LOWER STAGE

This is a National Phase Application filed under 35 U.S.C. 371 as a national stage of PCT/JP2019/046216, filed Nov. 26, 2019, an application claiming the benefit of Japanese Application No. 2018-229249, filed Dec. 6, 2018, the content of each of which is hereby incorporated by reference in its entirety.

TECHNICAL FIELD

An exemplary embodiment of the present disclosure relates to a plasma processing apparatus and a lower stage.

BACKGROUND

A conventional plasma processing apparatus is described in Patent Documents 1 and 2. In the documents, in order to make more uniform the intensity distribution of an electric field formed between the two electrodes in a plane parallel to the processing surface of an object to be processed, the distance between an upper electrode and a lower electrode is set to be partially different in the plane. There are various plasma generation methods, and a capacitively coupled plasma (CCP) processing apparatus that uses a frequency in a very high frequency (VHF) band for plasma generation is drawing attention. The VHF band is a frequency in the range of about 30 MHz to 300 MHz. Generally, a structure that radiates electromagnetic waves perpendicular to the surface of a wafer is known.

PRIOR ART DOCUMENTS

Patent Documents

Patent Document 1: Japanese Laid-Open Patent Publication No. 9-312268
Patent Document 2: Japanese laid-open publication No. 2014-53309

A plasma processing apparatus capable of improving in-plane uniformity of plasma and a lower stage used for the plasma processing apparatus are anticipated.

SUMMARY

In an exemplary embodiment, a lower stage is provided which generates plasma with an upper electrode. The lower stage includes: a lower dielectric body formed of ceramic, a lower electrode embedded in the lower dielectric body, and a heating element embedded in the lower dielectric body. The separation distance ($d_{edge}$) between the top surface of the lower dielectric body at the outer edge position thereof and the lower electrode is smaller than the separation distance ($d_{center}$) between the top surface of the lower dielectric body in the central region thereof and the lower electrode. The lower electrode has an inclination region inclined with respect to the top surface between the outer edge position and the central region.

With the plasma processing apparatus according to an exemplary embodiment and the lower stage used therein, it is possible to improve the in-plane uniformity of plasma.

DETAILED DESCRIPTION

Figure 1:
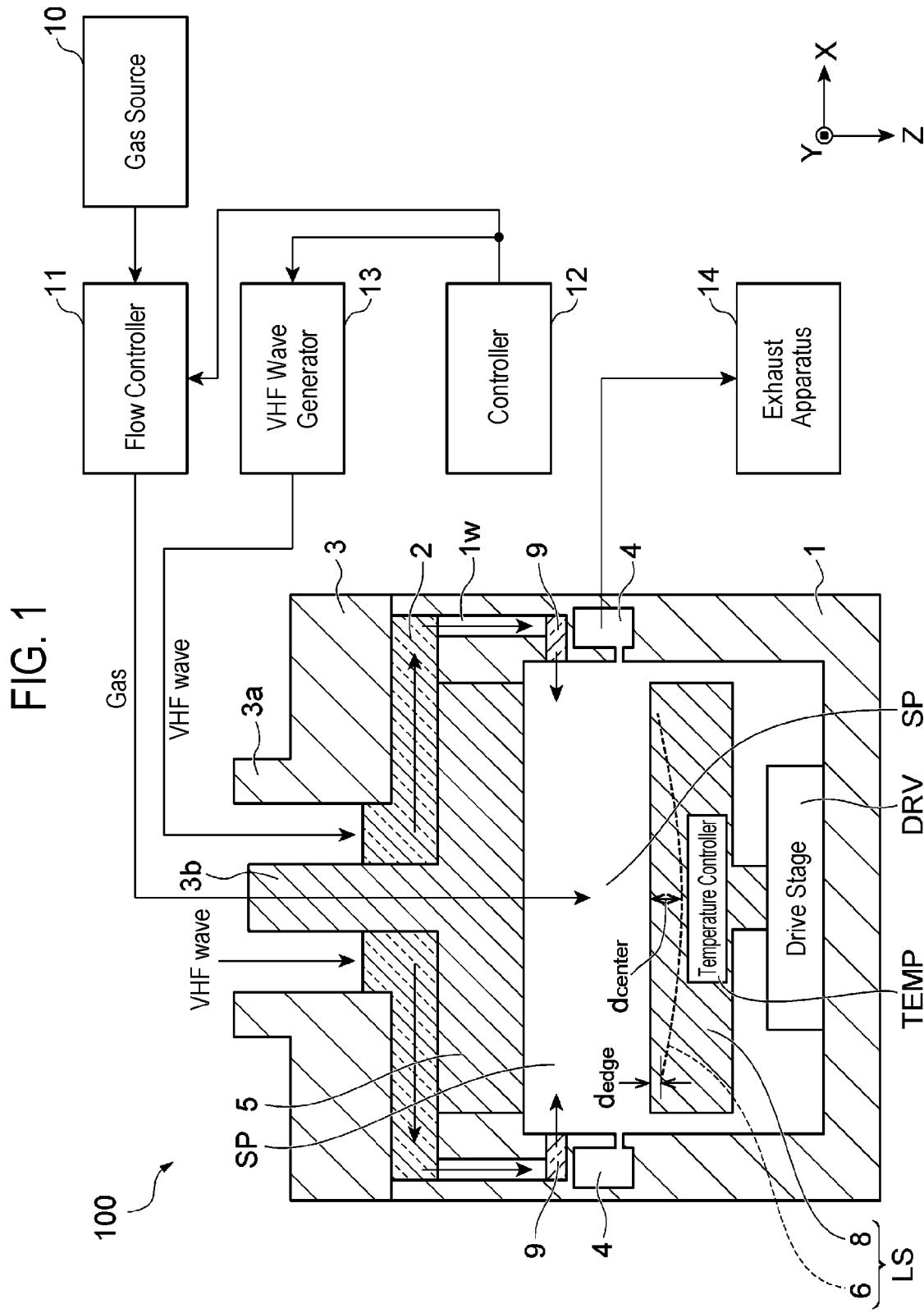
FIG. 1 is an explanatory view illustrating the configuration of a plasma processing apparatus.

Hereinafter, various exemplary embodiments will be described.

In an exemplary embodiment, the lower stage is for a lower stage that generates plasma with an upper electrode. The lower stage includes: a lower dielectric body formed of ceramic, a lower electrode embedded in the lower dielectric body, and a heating element embedded in the lower dielectric body. The separation distance ($d_{edge}$) between the top surface of the lower dielectric body at the outer edge position thereof and the lower electrode is smaller than the separation distance ($d_{center}$) between the top surface of the lower dielectric body in the central region thereof and the lower electrode. The lower electrode has an inclination region inclined with respect to the top surface between the outer edge position and the central region.

The lower electrode is in the form of a mesh or a thin film, or is formed through a printing method, and is embedded in the ceramic. In this case, along with the lower electrode, the lower dielectric body tends to bend an in-plane electric field vector group such that the in-plane electric field vector group is perpendicular to the surface of the lower stage. Therefore, when VHF waves are introduced onto the lower stage to generate plasma, the in-plane uniformity of plasma is improved.

In an exemplary embodiment, a plasma processing apparatus including the lower stage is configured such that VHF power is capable of being supplied to the space between the upper electrode and the lower electrode. Plasma is generated between the upper electrode and the lower electrode by the VHF waves.

In one exemplary embodiment, in the plasma processing apparatus, a three-dimensional orthogonal coordinate system having a Z axis set in the downward direction of the normal in the thickness direction at the center of the lower electrode, an X axis perpendicular to the Z axis, and a Y axis perpendicular to both the Z axis and the X axis is set. When the origin of the coordinate system is the gravity center position of the top surface of the lower dielectric body, it is assumed that the relative permittivity of the lower dielectric body is $\varepsilon_r$, the speed of light is c, the frequency of VHF power is f, the circular constant is $\pi$, and the wave number of VHF power in the dielectric body is k ($=(\varepsilon_r)^{0.5} \cdot 2\pi f/c$). The position (x, z) of the top surface of the lower electrode in the XZ plane is set to satisfy the following equation: $dx/dz=-2/xk \cdot \cot(kz)$. In this case, an electric field is generated on the surface of the lower electrode as a conductor, and this electric field is capable of canceling the lateral component of an electric field in the plasma generation space.

In an exemplary embodiment, the material of the ceramic may be AlN. AlN, which is highly resistant to heat, has an advantage of high resistance to plasma.

In another exemplary embodiment, VHF power is capable of being introduced into the space between the upper electrode and the lower stage from the lateral side of the processing container as VHF waves. The VHF waves are capable of being introduced into the processing container through a waveguide, and the VHF waves generate plasma between the upper electrode and the lower electrode. When VHF waves are introduced from a VHF wave introduction part between the upper electrode and the lower electrode, the internal gas is plasmatized so as to generate plasma. In this case, the VHF wave introduction part is located at the lateral end portion (horizontal end portion), and the VHF waves are introduced from various lateral directions to this space, which makes it difficult to form standing waves.

In an exemplary embodiment, the lower stage may be driven to be movable in the vertical direction.

That is, since it is possible to change the distribution state of plasma by moving the position of the lower stage, it is possible to enhance the in-plane uniformity of plasma by moving the lower stage such that the plasma is generated most uniformly and stably. Hereinafter, a plasma processing apparatus according to an embodiment will be described. The same reference numerals are used for the same elements, and duplicate descriptions are omitted.

FIG. 1 is an explanatory view illustrating the configuration of a plasma processing apparatus 100 according to an exemplary embodiment. For convenience of description, a three-dimensional orthogonal coordinate system is set. It is assumed that the vertical direction of the plasma processing apparatus is the Z-axis direction, and the two directions perpendicular to the Z axis are the X-axis direction and the Y-axis direction, respectively.

The plasma processing apparatus 100 includes a lower stage LS. The lower stage LS is a lower stage for generating plasma with an upper electrode 5. The lower stage LS includes a lower dielectric body 8 made of ceramic, a lower electrode 6 embedded in the lower dielectric body 8, and a temperature controller TEMP (including a heating element) embedded in the lower dielectric body 8.

The plasma processing apparatus 100 includes the upper electrode 5 and the lower electrode 6 disposed to face each other in the processing container 1, and generates plasma in the space SP between these electrodes. The upper electrode 5 may be provided with a recess in the bottom surface thereof, and an upper dielectric body may be disposed in the recess. As an example, a VHF wave introduction part 9 may be provided in the lateral end portion of the space SP.

A VHF wave waveguide 2 made of a dielectric plate is provided on the upper open end of the processing container 1, and a lid member 3 is provided on the VHF wave waveguide 2 as needed. The center of the lid member 3 is open, the side wall around the opening constitutes an outer conductor 3a of a coaxial tube, and an inner conductor 3b is disposed at the axial center. The inner conductor 3b is integrally formed with the upper electrode 5, and is electrically connected to the upper electrode 5.

The top surface of the lower dielectric body 8 is flat and parallel to the XY plane. The planar shapes (the shapes viewed in the Z-axis direction) of the lower dielectric body 8 and the lower electrode 6 are circular. A mesh-shaped lower electrode 6 is used in order to deform the effective shape of the lower dielectric body 8 that affects VHF waves. That is, the separation distance ($d_{edge}$) between the top surface of the lower dielectric body 8 at the outer edge position thereof and the lower electrode is smaller than the separation distance ($d_{center}$) between the top surface of the lower dielectric body 8 in the central region thereof and the lower electrode 6. The lower electrode 6 has an inclination region inclined with respect to the top surface (XY plane) between the outer edge position and the central region. In this example, the lower electrode 6 has a shape that is recessed downward, and the entire region except the center is an inclination region. For VHF waves, the lower dielectric body 8 effectively acts in the same manner as one having a thick central portion and a thin outer peripheral portion.

Figure 2:
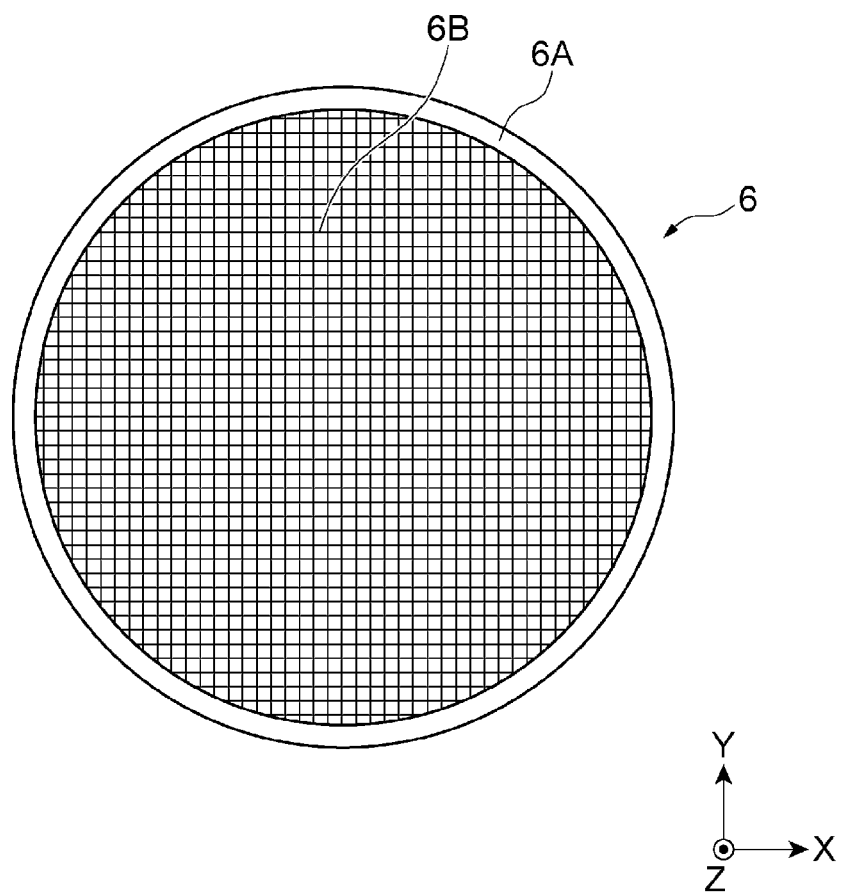
FIG. 2 is a plan view of a mesh-shaped lower electrode.

FIG. 2 is a plan view of a mesh-shaped lower electrode. As illustrated in FIG. 2, the lower electrode 6 has a mesh shape, and includes an outer frame portion 6A made of a conductor and a mesh main body 6B made of a conductor designated in the outer frame portion 6A. The size of one opening in the mesh is about 1 mm, and is preferably 0.5 mm to 3 mm from the viewpoint of electromagnetic wave shielding. In other words, when the opening is circular, the area of one opening is preferably about 0.785 $mm^2$ (e.g., ±20%), and is preferably 0.196 $mm^2$ to 28.3 $mm^2$ from the viewpoint of electromagnetic wave shielding. When the opening is square-shaped, the area of one opening is preferably about 1 $mm^2$ (e.g., ±20%), and is preferably 0.25 $mm^2$ to 9 $mm^2$ from the viewpoint of electromagnetic wave shielding. The lower electrode 6 is embedded in ceramic. The material of the lower electrode 6 is preferably a material that is capable of withstanding the sintering formation of the lower dielectric body 8, and Ta or Mo may be used. Along with the mesh-shaped lower electrode 6, the lower dielectric body 8 tends to bend an in-plane electric field vector group such that the in-plane electric field vector group is perpendicular to the surface of the lower stage. Accordingly, when VHF waves are introduced to the lower stage to generate plasma, the in-plane uniformity of the plasma is improved.

VHF waves introduced into the central portion of the VHF waveguide 2 in the horizontal direction propagate radially to the peripheral portion in the horizontal direction. Thereafter, the VHF waves travel downward through a waveguide 1w constituted with a recess (which has a circular ring shape in planar shape and has a depth in the Z-axis direction) provided in the side wall of the processing container 1, are introduced into the VHF wave introduction part 9, and travel to the central portion from the outer peripheral portion. The planar shape of the VHF wave introduction part 9 is a circular ring shape, and the VHF waves travel from all azimuths in the horizontal direction toward the axial center of the processing container. The VHF wave introduction part 9 is located in the lateral direction of the plasma generation space SP.

In addition, VHF power is introduced into the space between the upper electrode and the lower stage from the lateral side of the processing container as VHF waves. The VHF waves generated from a VHF wave generator 13 pass through the waveguide, and are introduced into the horizontal VHF wave waveguide 2. Thereafter, as described above, when VHF waves are introduced from the VHF wave introduction part 9 into the space between the upper electrode 5 and the lower electrode 6, the gas inside the processing container is plasmatized and thus plasma is generated. In this case, the VHF wave introduction part 9 is located at the lateral end portion (horizontal end portion), and VHF waves are introduced from various lateral directions into this space. Thus, there is an advantage in that standing waves are difficult to be formed. In addition, electric field vectors generated between the upper electrode 5 and the lower electrode 6 tend to be inclined downward and outward from the vertical direction in the outer peripheral region of the electrode. Since the lower electrode 6 is provided with the lower dielectric body 8 that bends the electric field vector, it is possible to make the electric field vectors uniform in the plane by the dielectric body. Therefore, it is possible to make the distribution of plasma generated between the upper electrode 5 and the lower electrode 6 uniform in the plane by introducing VHF waves in the lateral direction and making the directions of electric field vectors uniform. That is, the lower dielectric body 8 has a lens function of bending electric field vectors.

The lower electrode 6 is capable of being moved in the vertical direction by a drive stage DRV. This makes it possible to generate plasma under an optimum condition. The lower electrode 6 is provided with a temperature controller TEMP. The temperature controller TEMP includes a medium passage configured to allow a cooling medium to flow therethrough, a heating element (heater), and a temperature sensor, and the controller 12 controls the lower electrode 6 to reach a target temperature. For example, when the target temperature is T1 degrees C. and the output of the temperature sensor is lower than T1 degrees C., the heater is heated, and when the output is higher than T1 degrees C., the cooling medium is controlled to flow through the medium passage without heating the heater. Here, the heating element as the temperature controller TEMP is preferably embedded in the lower dielectric body 8, and may be made of a material such as a high-melting point metal described above or carbon. A feeding wire is connected to the heating element.

The controller 12 also controls an exhaust apparatus 14. The exhaust apparatus 14 exhausts the gas in the annular exhaust passage 4 provided in the outer wall of the processing container 1. The exhaust passage 4 is provided in the lateral direction of the plasma generation space SP, and communicates with multiple exhaust holes provided along the circumferential direction in the inner surface of the processing container. This makes it possible to exhaust the gas in the plasma generation space SP, and to set the pressure in this space to an appropriate value. This pressure may be changed depending on a processing content, and may be set to, for example, 0.1 Pa to 100 Pa. As the exhaust apparatus 14, a pump usually used in a vacuum system apparatus, such as a rotary pump, an ion pump, a cryostat, or a turbo molecular pump, may be adopted.

The controller 12 controls a flow controller 11 that controls the flow rate of the gas generated from a gas source 10. The flow controller 11 may be merely a valve. This makes it possible to introduce a target gas into the processing container 1. The controller 12 also controls the VHF wave generator 13. The frequency of VHF waves is about 30 MHz to 300 MHz.

Examples of gases that can be used for the gas source 10 may include gases containing carbon and fluorine, such as $CF_4$ and $C_4F_8$, and gases such as $N_2$ and $O_2$, in addition to rare gases such as Ar.

Aluminum may be used as the material for the upper electrode 5 and the lower electrode 6. Aluminum nitride (AlN) may be used as the material of the lower dielectric body 8. That is, the ceramic material constituting the lower dielectric body 8 is AlN. AlN, which is highly resistant to heat, has an advantage of high resistance to plasma. Quartz may be used as the material of the VHF wave waveguide 2 in the horizontal direction, but air may be used as long as the waveguide can be formed.

As for a substrate disposed on the lower dielectric body 8, silicon or the like may be used, and the substrate may be subjected to processing such as film formation or etching. If necessary, it is conceivable to provide an electrostatic chuck, to add DC bias potential to the lower dielectric body 8, or in some cases, to apply a high-frequency voltage between the upper and lower electrodes, and it is also conceivable to arrange magnets around the processing container.

In the introduction of VHF waves, it is possible to supply VHF power to the space between the upper electrode 5 and the lower electrode 6. Plasma is generated between the upper electrode and the lower electrode by the VHF waves.

In addition, the plasma processing apparatus sets a three-dimensional orthogonal coordinate system having a Z axis set in the downward direction of the normal in the thickness direction at the center of the lower electrode, an X axis perpendicular to the Z axis, and a Y axis perpendicular to both the Z axis and the X axis. When the origin of the coordinate system is the gravity center position of the top surface of the lower dielectric body, the lower electrode is set as follows. It is assumed that the relative permittivity of the lower dielectric body is $\varepsilon_r$, the speed of light is c, the frequency of VHF power is f, the circular constant is 7E, and the wave number of VHF power in the dielectric body is k $(=(\varepsilon_r)^{0.5} \cdot 2\pi f/c)$. The position (x, z) of the top surface of the lower electrode in the XZ plane is set to satisfy the following Equation 1.

$$dx/dz = -2/xk \cdot \cot(kz) \qquad \text{[Equation 1]}$$

In this case, an electric field is generated on the surface of the lower electrode as a conductor, and this electric field is capable of canceling the lateral component of an electric field in the plasma generation space. Since the above relationship is established not in the XZ cross section but in any vertical cross section parallel to the Z axis and including the Z axis, when r is used as the radial position of the lower electrode instead of x, $dr/dz = -2/rk \cdot \cot(kz)$ will be satisfied. In addition, the wave number $k = (\varepsilon_r)^{0.5} \cdot k_0 = (\varepsilon_r)^{0.5} \cdot \omega/c = (\varepsilon_r)^{0.5} \cdot 2\pi f/c$ is satisfied. $k_0$ is a reference wave number.

The wave number k of the VHF power in the dielectric body, the distance r (mm) in the radial direction, and the distance z from the surface of the lower dielectric body to the lower electrode satisfy the above relational expression and form the shape of the inclination region. In Equation 1, an electric field vector in the plasma generation space is obtained, and an electric field, which cancels the radial component of the electric field vector, is set to be generated on the surface of the lower electrode. That is, the electric field E in the plasma generation space has a radial component (Equation 2 below) and a Z-axis direction component (Equation 3 below). Since the electric field on the surface of a conductor is perpendicular to the surface, by setting $dr/dz = E_z/(-E_r)$ to cancel $E_r$, $dr/dz = E_z/(-E_r) = -2/rk \cdot \cot(kz)$ can be obtained with Equation 1.

$$\text{Radial component of electric field: } E_r(r,z) = (E_0 k/2) \cdot r \sin(kz) \qquad \text{[Equation 2]}$$

$$\text{Z-axis direction component of electric field: } E_z(r,z) = E_0 \cos(kz) \qquad \text{[Equation 3]}$$

When the differential equation of Equation 1 is satisfied, the shape of the lower electrode becomes the shape derived in Equation 4 or Equation 5 below. a and $a_0$ are appropriate constants, and $E_0$ is a reference electric field generated in the plasma generation space.

$$\sin(kz) = a \cdot \exp(-k^2 r^2/4) \qquad \text{[Equation 4]}$$

$$z = a_0 \cdot \exp(-k^2 r^2/4) \text{ (when } k \cdot r \ll 1) \qquad \text{[Equation 5]}$$

In addition, r can be replaced with x.

Figure 3:
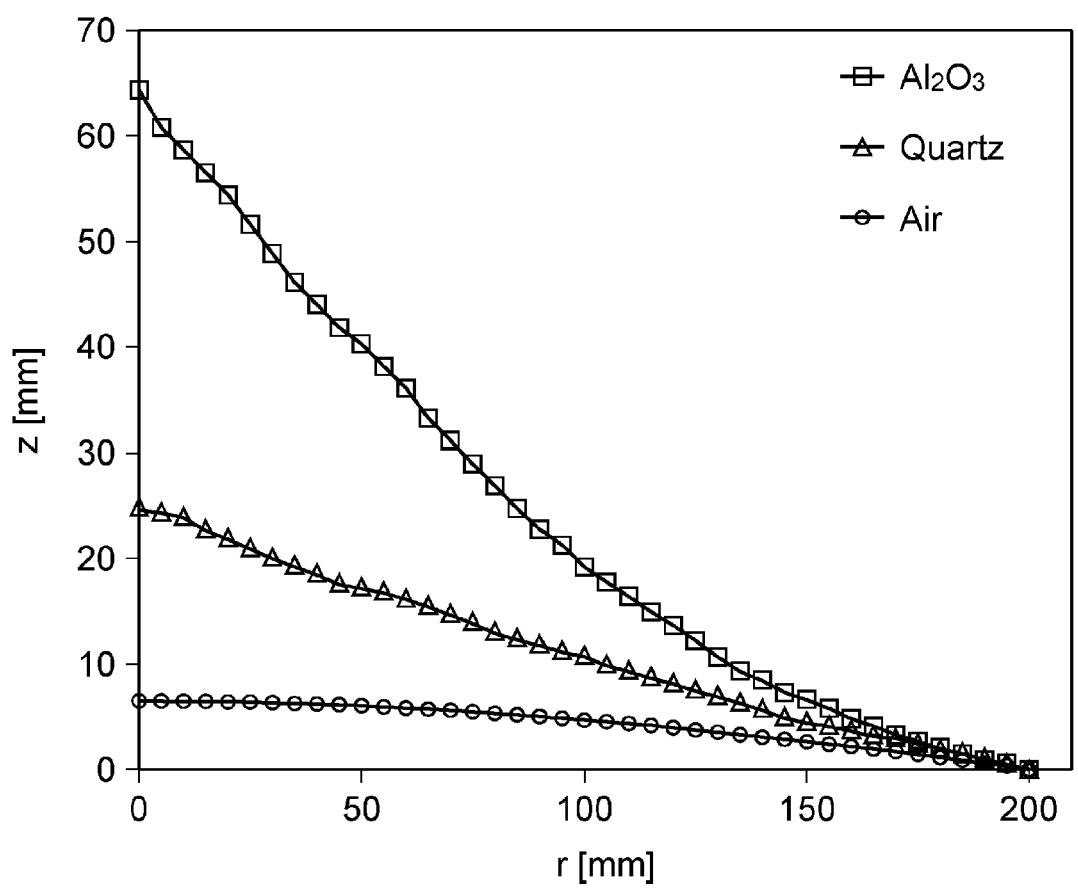
FIG. 3 is a graph showing a relationship between a radial distance r (mm) from the center and a position z (mm).

FIG. 3 is a graph showing the relationship between a radial distance r (mm) from the center and a position z (mm) on the Z axis. In addition, z is the distance from the surface of the lower dielectric body to the lower electrode. Since the downward direction in the Z axis is the positive direction, the shape of the lower electrode is a downwardly convex shape in an arbitrary vertical cross section as shown in the graph.

The figure shows the case where alumina ($Al_2O_3$) is used as the lower dielectric body, the case where quartz (Quartz) is used as the lower dielectric body, and the case where air (Air) is used as the lower dielectric body, in which the higher the dielectric constant, the more inclined the lower electrode body. When the diameters of the lower electrode and the lower dielectric body is 200 mm, even if the thickness of the lower dielectric body in the Z-axis direction is 70 mm or less, the above-mentioned effect is achieved so that the lateral component of the electric field vector can be canceled and the in-plane uniformity of plasma can be improved.

The lower stage LS is driven by the drive stage DRV to be movable in the vertical direction. That is, since it is possible to change the distribution state of plasma by moving the position of the lower stage LS, it is possible to enhance the in-plane uniformity of plasma by moving the lower stage such that the plasma is generated most uniformly and stably.

In addition, various methods of introducing gas may be considered. For example, in the inner conductor 3b located in the center of the upper electrode 5, a through hole may be formed along the Z-axis direction to serve as a gas introduction path. In addition, an upper dielectric body may be provided on the bottom surface of the upper electrode, and the upper dielectric body may have a shower structure having multiple through holes. This makes it possible to enhance the in-plane uniformity of gas concentration.

In the upper structure of the processing container 1, a horizontally extending waveguide communicating with the waveguide 1w constituted with a recess provided in the side wall of the processing container 1 may be formed in place of a solid dielectric waveguide. Then, an insulator block made of a ring-shaped insulator may be disposed between the outer conductor 3a and the inner conductor 3b. As a result, VHF waves introduced from the upper portion of the insulator block reach the vertical waveguide 1w through the horizontal waveguide, and are introduced into the processing container through the VHF wave introduction part 9.

EXPLANATION OF REFERENCE NUMERALS

DRV: drive stage, SP: plasma generation space, TEMP: temperature controller, 1: processing container, 1w: waveguide, 2: VHF wave waveguide, 3: lid member, 3a: outer conductor, 3b: inner conductor, 4: exhaust passage, 5: upper electrode, 6: lower electrode, 8: lower dielectric body, 9: VHF wave introduction part, 10: gas source, 11: flow controller, 12: controller, 13: VHF wave generator, 14: exhaust apparatus, 100: plasma processing apparatus

What is claimed is:

1. A plasma processing apparatus including a lower stage configured to generate plasma with an upper electrode, the lower stage comprising:
a lower dielectric body formed of ceramic;
a lower electrode embedded in the lower dielectric body; and
a heating element embedded in the lower dielectric body,
wherein a separation distance ($d_{edge}$) between a top surface of the lower dielectric body at an outer edge position thereof and the lower electrode is smaller than a separation distance ($d_{center}$) between the top surface of the lower dielectric body in a central region thereof and the lower electrode,
wherein the lower electrode has an inclination region inclined with respect to the top surface between the outer edge position and the central region,
wherein VHF power is supplied to a space between the upper electrode and the lower electrode, and
wherein, when a three-dimensional orthogonal coordinate system having a Z axis set in a downward direction of a normal in a thickness direction at a center of the lower electrode, an X axis perpendicular to the Z axis, and a Y axis perpendicular to both the Z axis and the X axis is set, and an origin of the coordinate system is a gravity center position of the top surface of the lower dielectric body, and
when it is assumed that a relative permittivity of the lower dielectric body is $\varepsilon_r$, a speed of light is c, a frequency of VHF power is f, a circular constant is $\pi$, and a wave number of VHF power in the dielectric body is $k(=(\varepsilon_r)^{0.5} \cdot 2\pi f/c)$,
a position (x, z) of the top surface of the lower electrode in an XZ plane is set to satisfy a following equation:

$$dx/dz = -2/xk \cdot \cot(kz).$$

2. The plasma processing apparatus of claim 1, wherein a material of the ceramic is AlN.

3. The plasma processing apparatus of claim 2, wherein the VHF power is introduced into the space between the upper electrode and the lower stage from a lateral side of the processing container as VHF waves.

4. The plasma processing apparatus of claim 3, wherein the lower stage is driven to be movable in a vertical direction.

5. The plasma processing apparatus of claim 1, wherein the VHF power is introduced into the space between the upper electrode and the lower stage from a lateral side of the processing container as VHF waves.

6. The plasma processing apparatus of claim 1, wherein the lower stage is driven to be movable in a vertical direction.

* * * * *